United States Patent [19]
Mori

[11] Patent Number: 5,854,771
[45] Date of Patent: Dec. 29, 1998

[54] SEMICONDUCTOR MEMORY DEVICE INCLUDING COPY CIRCUIT

[75] Inventor: Kaori Mori, Hyogo, Japan

[73] Assignee: Mitsubishi Denki Kabushiki Kaisha, Tokyo, Japan

[21] Appl. No.: 963,355

[22] Filed: Nov. 3, 1997

[30] Foreign Application Priority Data

Apr. 28, 1997 [JP] Japan ..................................... 9-111168

[51] Int. Cl.$^6$ ....................................................... G11C 7/00
[52] U.S. Cl. ...................... 365/230.03; 365/207; 365/205
[58] Field of Search ............................... 365/230.03, 205, 365/207, 208, 230.06

[56] References Cited

U.S. PATENT DOCUMENTS

| | | | |
|---|---|---|---|
| 4,931,995 | 6/1990 | Okasaka et al. | 365/189.05 |
| 5,671,188 | 9/1997 | Patel et al. | 365/205 |
| 5,706,229 | 1/1998 | Yabe et al. | 365/205 |

FOREIGN PATENT DOCUMENTS

| | | |
|---|---|---|
| 62-18183 | 1/1987 | Japan . |
| 63-6644 | 1/1988 | Japan . |
| 63-178290 | 7/1988 | Japan . |
| 1-116990 | 5/1989 | Japan . |

*Primary Examiner*—Vu A. Le
*Attorney, Agent, or Firm*—McDemrott, Will & Emery

[57] ABSTRACT

A semiconductor memory device includes a plurality of sense amplifier groups, a sense amplifier drive circuit, a row decoder, and a memory array with a plurality of memory cells. Each sense amplifier group is activated according to a sense amplifier drive signal from the sense amplifier drive circuit. According to the timing of a word line selection in the row decoder and change in the sense amplifier drive signal, the semiconductor memory device has data of some memory cells connected to word line WLi copied speedily and selectively to other memory cells.

3 Claims, 10 Drawing Sheets

SEMICONDUCTOR MEMORY DEVICE INCLUDING COPY CIRCUIT

BACKGROUND OF THE INVENTION

1. Field of the Invention

The present invention relates to semiconductor memory devices, and more particularly to a semiconductor memory device that can copy data selectively at high speed.

2. Description of the Background Art

In a semiconductor memory device directed to image processing, particularly to three-dimensional graphic processing, the speed of rewriting the great amount of stored pixel data has become a critical factor in this field.

As a method directed to this factor, "Writing Method of Semiconductor Memory Device" that allows data to be written at high speed is disclosed (Japanese Patent Laying-Open No. 1-116990).

A conventional semiconductor memory device and this "Writing Method of Semiconductor Memory Device" will be described briefly hereinafter.

Figure 7:
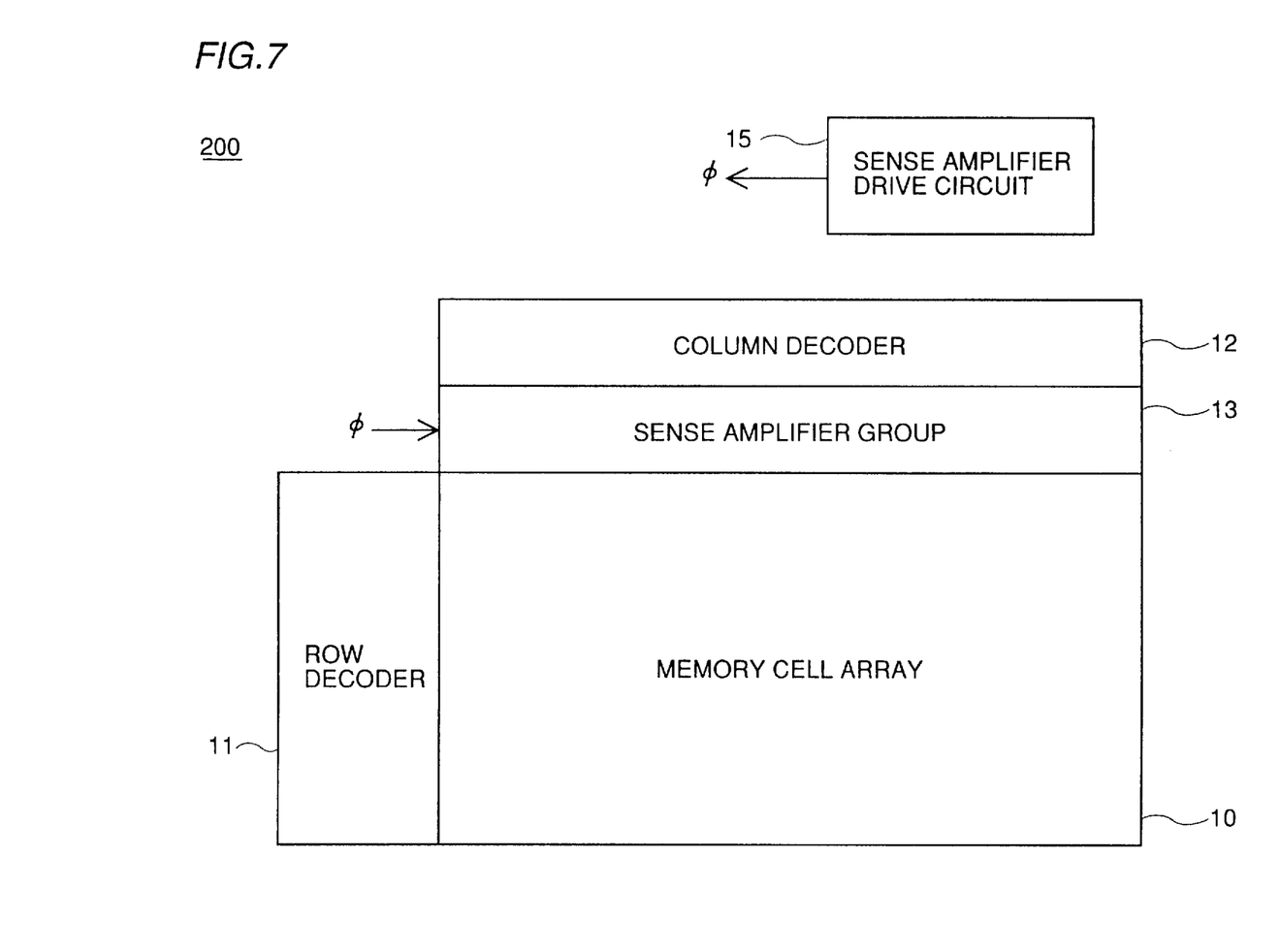
FIG. 7 is a block diagram showing an example of a basic structure of a conventional semiconductor memory device 200.
Figure 8:
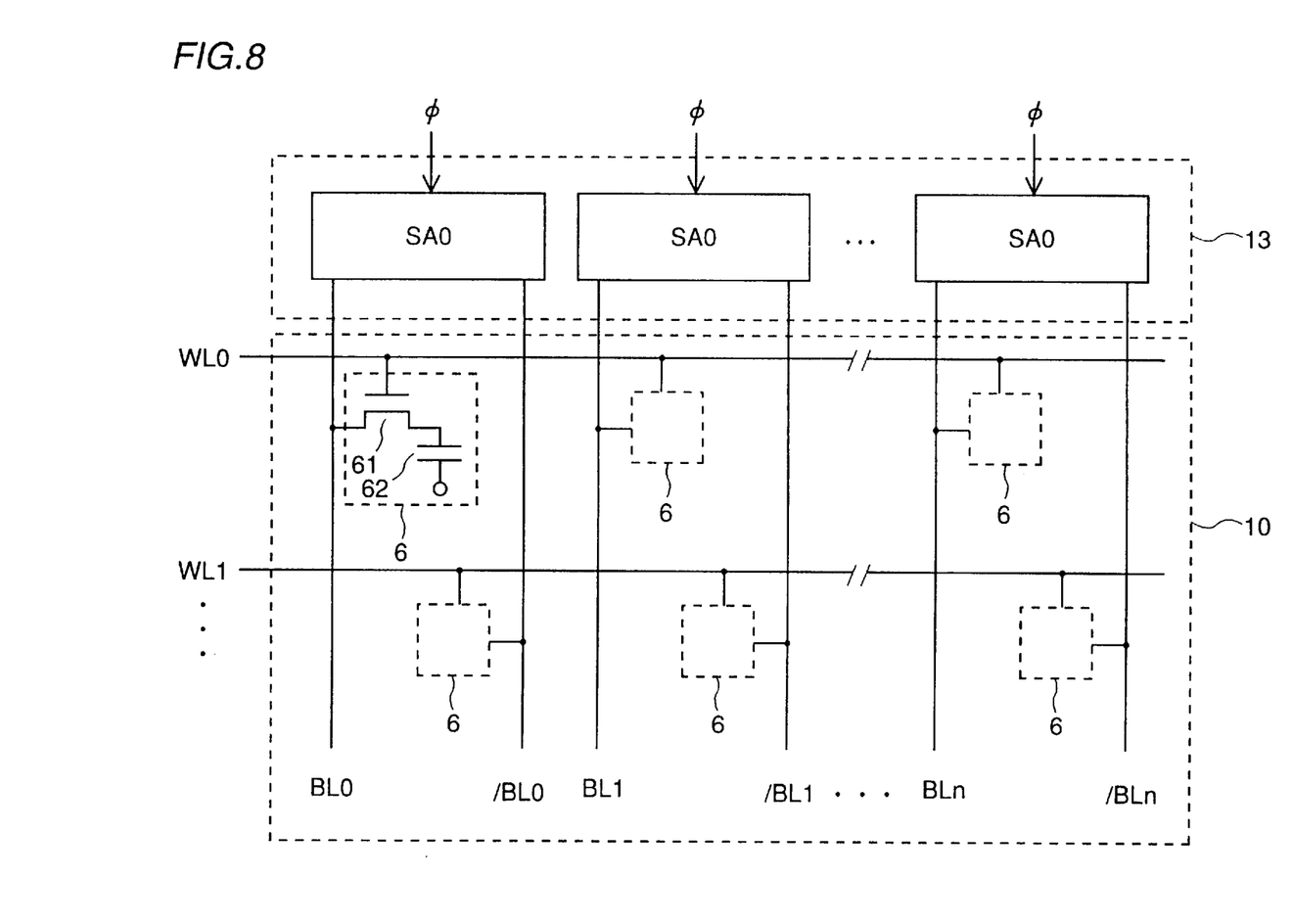
FIG. 8 shows an example of a structure related to sense amplifiers SA0 of a conventional semiconductor memory device 200.

FIG. 7 is a block diagram showing an example of a basic structure of a conventional semiconductor memory device 200. FIG. 8 shows an example of a structure related to sense amplifiers SA0 of conventional semiconductor memory device 200. Referring to FIGS. 7 and 8, semiconductor memory device 200 includes a memory cell array 10, a row decoder 11, a column decoder 12, a group of sense amplifiers 13, and a sense amplifier drive circuit 15.

Memory cell array 10 is connected to row decoder 11, column decoder 12, and sense amplifier group 13. Sense amplifier group 13 is connected to sense amplifier drive circuit 15.

Memory cell array 10 includes a plurality of memory cells 6 arranged in a matrix of rows and columns. Memory cell 6 includes a transistor 61 and a capacitor 62. Each memory cell 6 is connected by a word line WLi (i=0, 1, . . . ) in the row direction, and connected by a bit line pair BLi, /BLi (i=0, 1, . . . , n) in the column direction.

Row decoder 11 selects a row of memory cell array 10, i.e. word line WLi. Column decoder 12 selects a column of memory cell array 10, i.e. a bit line pair BLi, /BLi.

Sense amplifier group 13 includes a plurality of sense amplifiers SA0. Each sense amplifier SA0 is connected to one bit line pair BLi, /BLi.

Sense amplifier drive circuit 15 generates and provides a sense amplifier drive signal φ. Sense amplifier SA0 receives sense amplifier drive signal φ at input to be rendered active. The potential difference between the connected pair of bit line BLi, /BLi is sensed and amplified.

The writing method of a semiconductor memory device disclosed in Japanese Patent Laying-Open No. 1-116990 allows data to be written (copied) successively to another word line WLk by pulling up and down the potential of word line WLi while holding data in bit line pair BLi, /BLi.

A copy operation of rewriting at high speed the stored information in conventional semiconductor memory device 200 by the above method will be described hereinafter.

Figure 9:
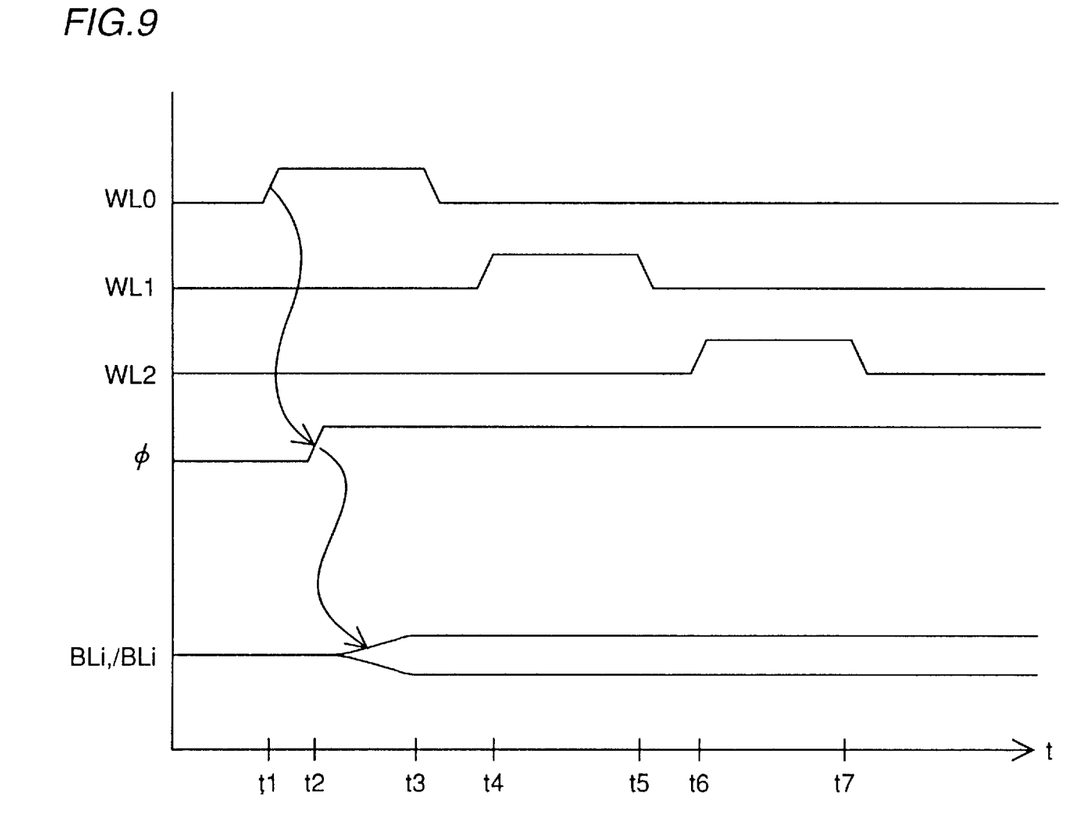
FIG. 9 is a timing chart for describing an example of a copy operation in a conventional semiconductor memory device 200.
Figure 10:
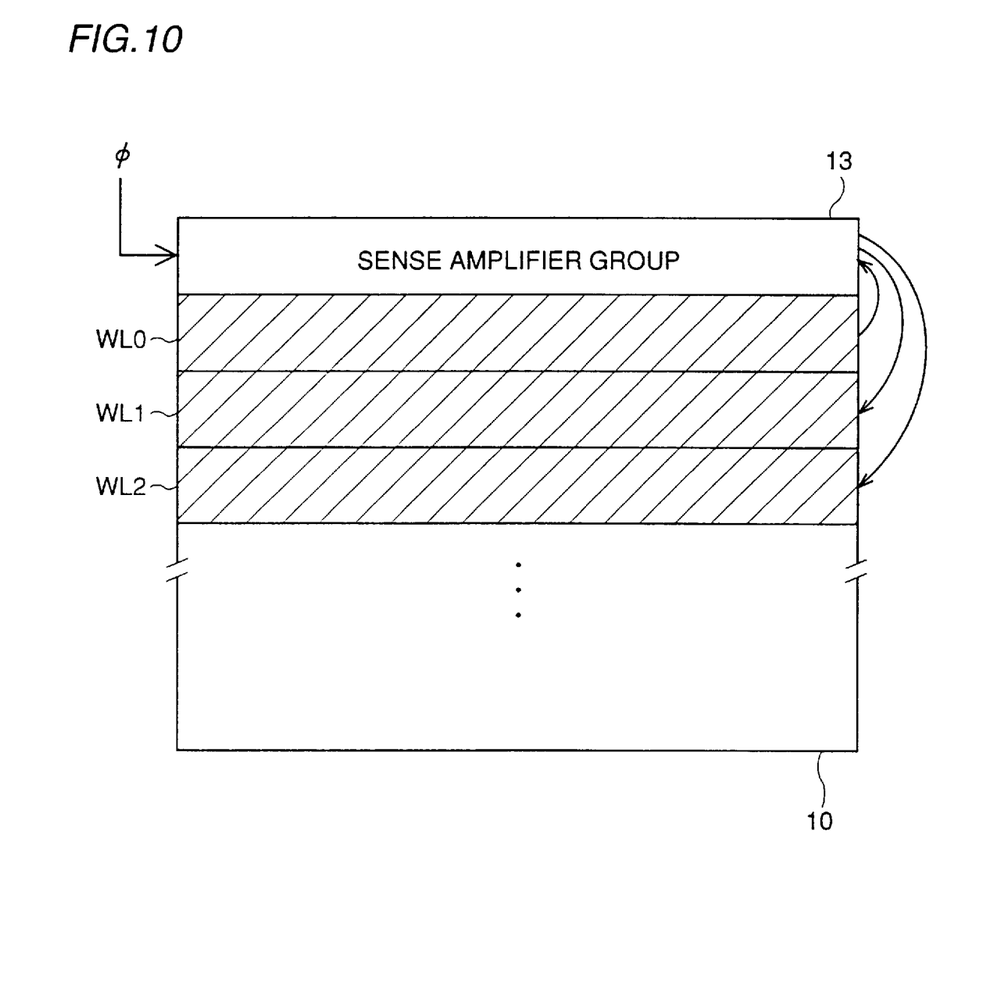
FIG. 10 schematically shows the result of a copy operation in conventional semiconductor memory device 200 of FIG. 9.

FIG. 9 is a timing chart for describing an example of a copy operation of conventional semiconductor memory device 200, and FIG. 10 schematically represents the result of the copy operation of FIG. 9.

Semiconductor memory device 200 has the data of memory cell 6 connected to word line WL0 of memory cell array 10 sequentially copied into memory cell 6 connected to word lines WL1 and WL2 according to the procedure set forth in the following. Although not particularly described, the potential of word line WLi is pulled up or down by row decoder 11.

At time t1, the potential of word line WL0 is pulled up. In response, the potential of the bit line pair BLi, /BLi connected to each memory cell 6 is altered according to the stored information in memory cell 6 connected to word line WL0.

At time t2, sense amplifier drive signal φ is pulled up to an H level (logical high) from an L level (logical low). In response, all the sense amplifiers SA0 forming sense amplifier group 13 are rendered active.

Each sense amplifier SA0 senses the potential difference of a corresponding pair of bit lines BLi, /BLi and amplifies the potential difference. The data amplified by a corresponding sense amplifier SA0 is rewritten into memory cell 6 connected to word line WL0.

At time t3, the potential of word line WL0 is pulled down. At this time point, all sense amplifiers SA have attained an active state. Each sense amplifier SA0 has latched data corresponding to the stored information in a corresponding memory cell 6 connected to word line WL0.

At time t4, the potential of word line WL1 rises. At this time point, sense amplifiers SA0 have attained an active state. By the current drive capability thereof, the pair of bit lines BLi, /BLi connected to each sense amplifier SA0 maintains the potential corresponding to the data latched by a corresponding sense amplifier SA0. The information of each memory cell 6 connected to word line WL1 is rewritten corresponding to the potential of the corresponding pair of bit lines BLi, /BLi.

At time t5, the potential of word line WL1 is pulled down. In response, each memory cell 6 connected to word line WL1 has the stored information of a corresponding memory cell 6 connected to word line WL0 copied thereto. At this time point, all sense amplifiers SA0 have attained an active state. Data corresponding to the stored information in memory cell 6 connected to word line WL0 has been latched.

At time t6, the potential of word line WL2 is pulled up. At this time point, sense amplifiers SA0 have attained an active state. Therefore, the pair of bit lines BLi, /BLi connected to each sense amplifier SA0 maintains the potential corresponding to the data latched by a corresponding sense amplifier SA0. The information of each memory cell 6 connected to word line WL2 is rewritten corresponding to the potential of a corresponding pair of bit lines BLi, /BLi.

At time t7, the potential of word line WL2 is pulled down. In response, the information of each memory cell 6 connected to word line WL0 is copied into a corresponding memory cell 6 connected to word line WL2.

By employing this writing method of a semiconductor memory device in the usage of conventional semiconductor memory device 200 for image processing, pixel data can be copied at a high speed.

However, the above-described method with a conventional semiconductor memory device 200 allows data to be copied only in the unit of a word line. More specifically, the data in all memory cells 6 connected to one word line WLi is rewritten by the data of all memory cells 6 connected to word line WL0.

This means that copy of only a particular pixel data (for example, pixel data associated with red color R) cannot be effected in image processing such as in the case of storing pixel data associated with red R, associated with green G, and associated with blue B into memory cells 6 connected to one word line WLi. There was a problem that pixel data (for example, pixel data associated with green G) other than that particular pixel data will also be copied.

There is an approach of preparing an exclusive memory cell array for each pixel data to solve this problem. However, this approach will necessitate transfer between the memory cell arrays to result in reduction in the processing speed. Therefore, the subject of increasing the speed cannot be achieved.

SUMMARY OF THE INVENTION

An object of the present invention is to provide a semiconductor memory device in which stored information can be copied speedily and selectively.

Another object of the present invention is to provide a semiconductor memory device in which copying can be realized speedily and selectively in addition to the normal operation without affecting the chip size.

A semiconductor memory device of the present invention includes a plurality of memory cells arranged in rows and columns, and divided into a plurality of groups. Each of the plurality of groups includes a plurality of memory cells arranged in at least one column. The semiconductor memory device further includes a copy circuit for copying data stored in at least one memory cell in at least one of the groups to at least one another relevant memory cell in at least one group.

The main advantage of the present invention is to allow data stored in one group to be copied speedily and selectively to another group with a plurality of memory cells as a group.

The foregoing and other objects, features, aspects and advantages of the present invention will become more apparent from the following detailed description of the present invention when taken in conjunction with the accompanying drawings.

DESCRIPTION OF PREFERRED EMBODIMENTS

A semiconductor memory device of the present invention will be described hereinafter. Components corresponding to those of conventional semiconductor memory device 200 of FIG. 7 have the same reference characters allotted, and description thereof will not be repeated.

First Embodiment

In a semiconductor memory device according to a first embodiment of the present invention, stored data can be copied to another cell selectively at high speed.

Figure 1:
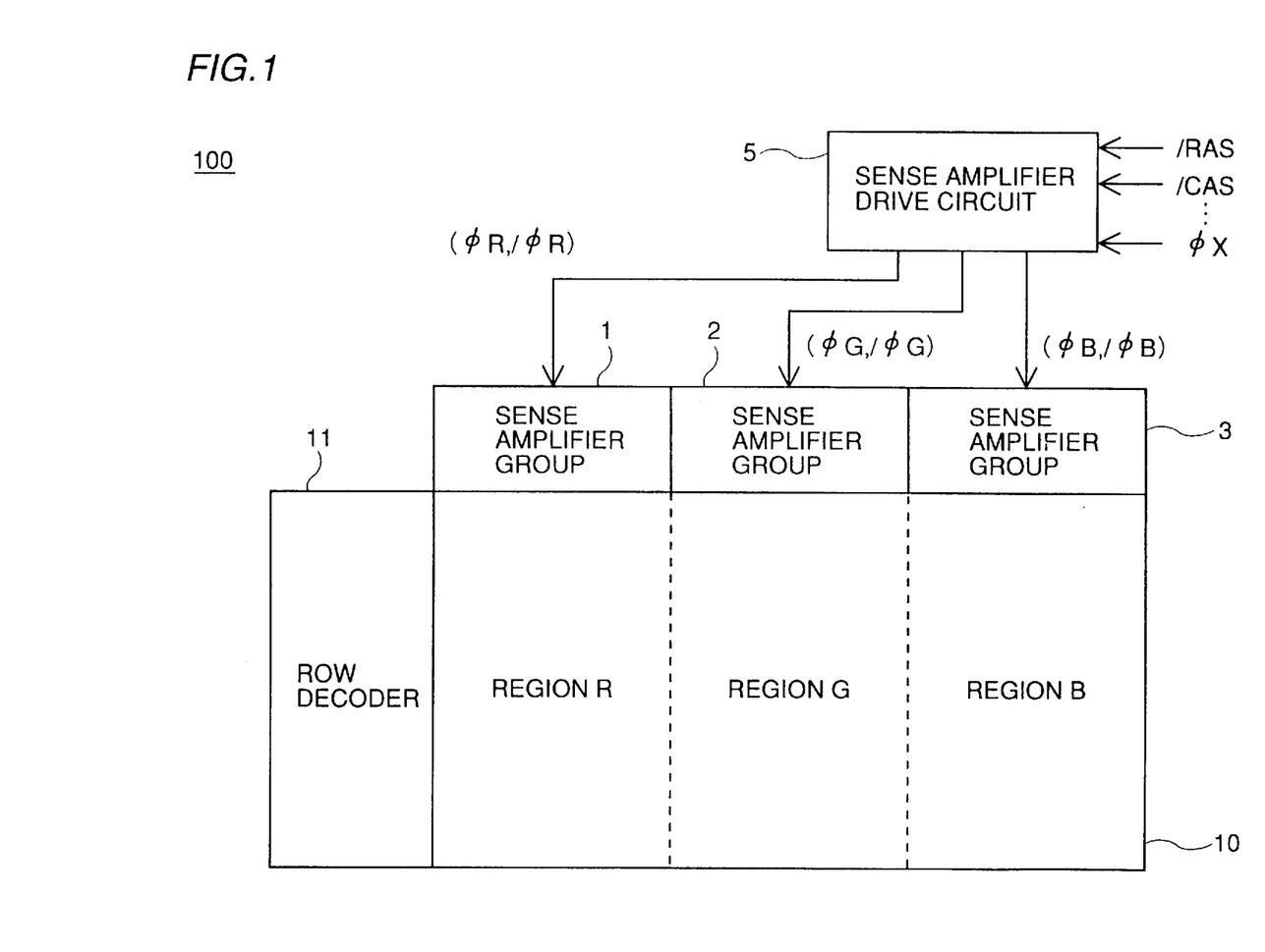
FIG. 1 is a block diagram of an example of a basic structure of a semiconductor memory device 100 according to a first embodiment of the present invention.
Figure 2:
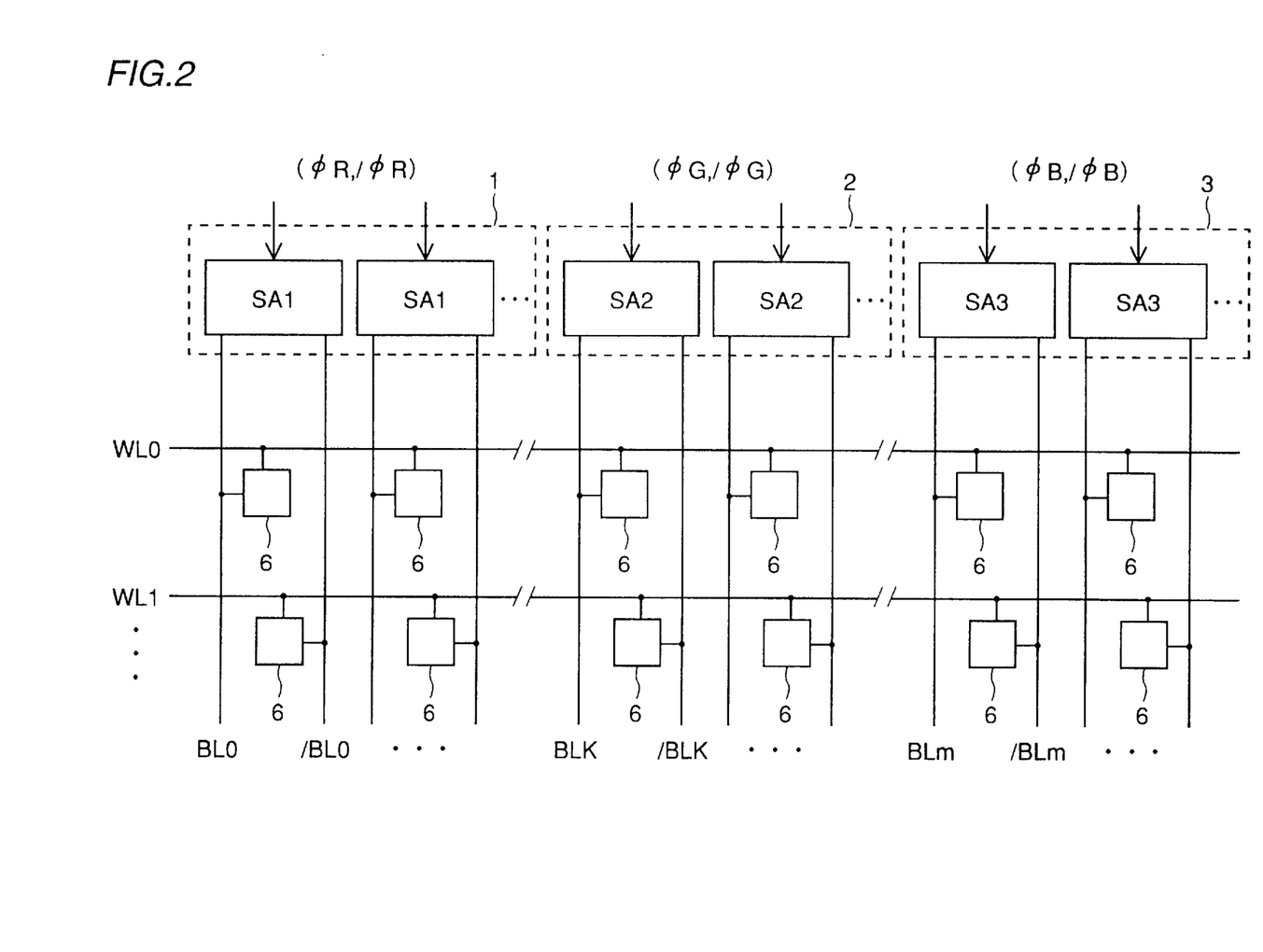
FIG. 2 shows a structure related to sense amplifier groups 1, 2 and 3 of semiconductor memory device 100 of the first embodiment of the present invention.

Referring to FIGS. 1 and 2, a semiconductor memory 100 of the first embodiment include a memory cell array 10, a row decoder 11, sense amplifier groups 1, 2, and 3, and a sense amplifier drive circuit 5.

Memory cell array 10 is connected to row decoder 11, and sense amplifier groups 1, 2 and 3. Each of sense amplifier groups 1, 2 and 3 is connected to sense amplifier drive circuit 5.

Sense amplifier group 1 includes a plurality of sense amplifiers SA1. Each sense amplifier SA1 is connected to one pair of bit lines BLi, /BLi (i=0 to k−1). Sense amplifier SA1 attains an active state/inactive state according to externally applied sense amplifier drive signals φR and φR.

Sense amplifier group 2 includes a plurality of sense amplifiers SA2. Each sense amplifier SA2 is connected to one pair of bit lines BLi, /BLi (i=k to m−1). Sense amplifier SA2 attains an active state/inactive state according to externally applied sense amplifier driver signals φG and φG.

Sense amplifier group 3 includes a plurality of sense amplifiers SA3. Each sense amplifier SA3 is connected to one pair of bit lines BLi, /BLi (i=m to n). Sense amplifier SA3 attains an active state/inactive state according to externally applied sense amplifier drive signals φB and φB.

Figure 3:
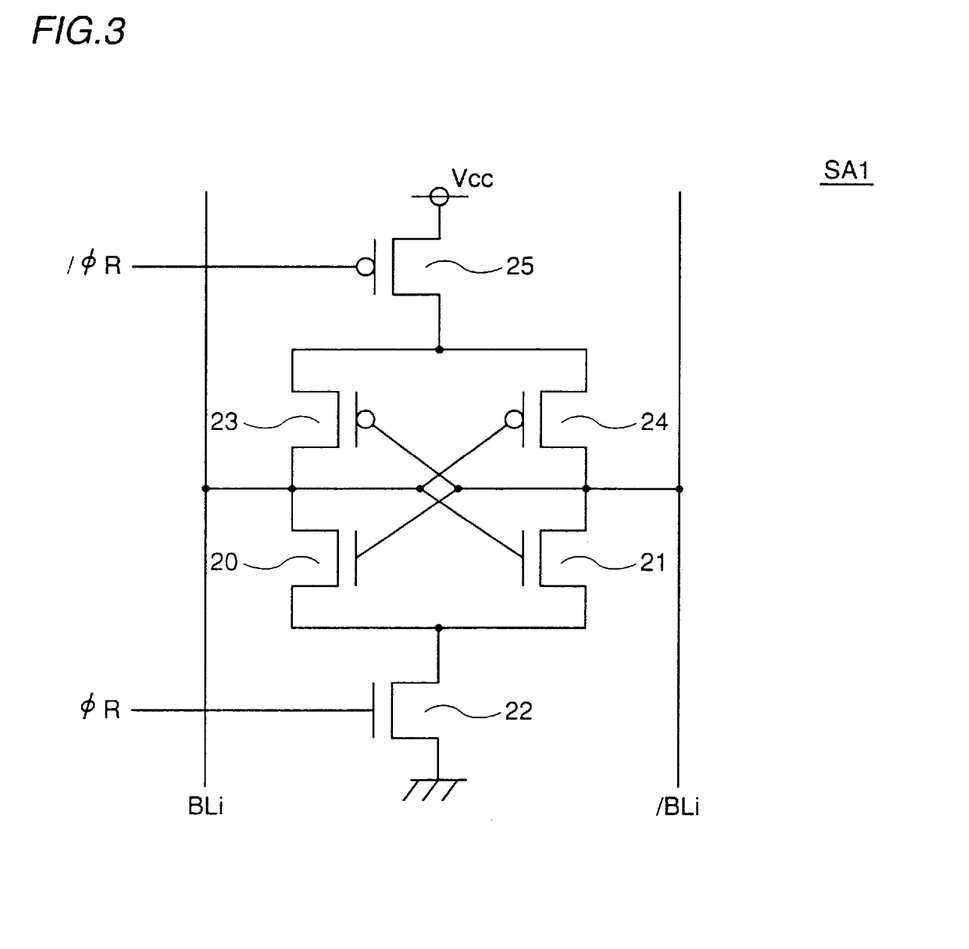
FIG. 3 shows a basic structure of a sense amplifier SA1 according to the first embodiment of the present invention.

Referring to FIG. 3, sense amplifier SA1 includes NMOS transistors 20, 21 and 22, and PMOS transistors 23, 24 and 25. Sense amplifier SA1 attains an active state/inactive state according to sense amplifier drive signals φR and φR.

Sense amplifiers SA2 and SA3 each have a specific structure similar to that of sense amplifier SA1 shown in FIG. 3.

For the sake of simplification, the group of memory cells 6 connected to bit line pair BLi, /BLi (i=0 to k−1) in memory cell array 10 is called a region R. The group of memory cells 6 connected to bit line pair BLi, /BLi (i=k to m−1) is called a region G. The group of memory cells 6 connected to bit line pair BLi, /BLi (i=m to n) is called a region B. Sense amplifier group 1 is connected to bit line pair BLi, /BLi in region R of memory cell array 10. Sense amplifier group 2 is connected to bit line pair BLi, /BLi in region G of memory cell array 10. Sense amplifier group 3 is connected to bit line pair BLi, /BLi in region B of memory cell array 10.

Sense amplifier driver circuit 5 receives various control signals such as sense amplifier activation signals φX for designating activation of memory cell array 10, a /RAS (row address strobe signal) and a /CAS (column address strobe signal) to generate and output sense amplifier drive signals ($\phi R$, $\phi R$), ($\phi G$, $\phi G$), ($\phi B$, $\phi B$) for controlling the active state of sense amplifiers SA1, SA2 and SA3.

Sense amplifier drive circuit 5 controls row decoder 11 so that word line WLi is sequentially activated for a predetermined time. After one word line WLi is activated, sense amplifier drive circuit 5 continues to activate the sense amplifier of at least one of regions R, G and B in which a copy operation is to be carried out, for example sense amplifier SA1 of region R. In the other regions that are not the subject of a copy operation, for example, in regions G and B, sense amplifiers SA2 and SA3 are activated after word line WLi is activated, and inactivated after word line WLi is inactivated.

Figure 4:
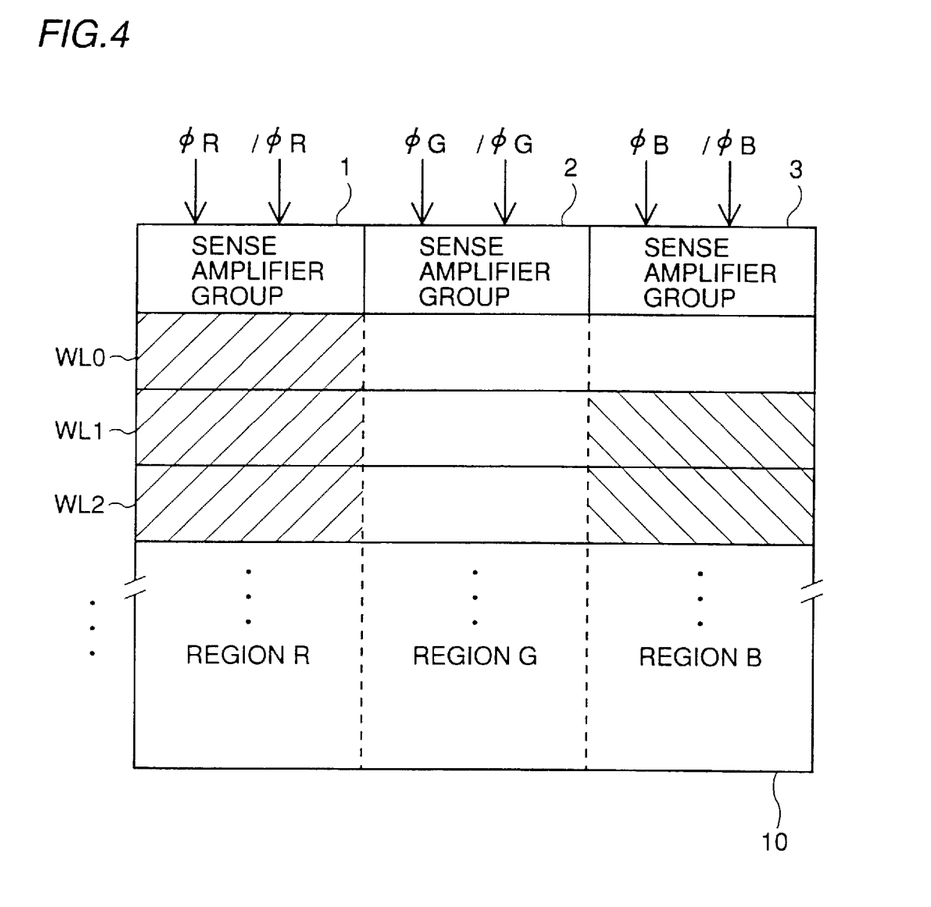
FIG. 4 shows an example of a copy operation of semiconductor memory device 100 according to the first embodiment of the present invention.

A copy operation of semiconductor memory device 100 of the first embodiment will be described hereinafter with reference to FIG. 4.

Semiconductor memory device 100 allows the stored information of some memory cells 6 to be copied into other memory cells 6. The copy operation of FIG. 4 includes copying data of word line WL0 to word lines WL1 and WL2 for region R, copying data of word line WL1 to word line WL2 for region B, and no rewriting for region G.

Figure 5:
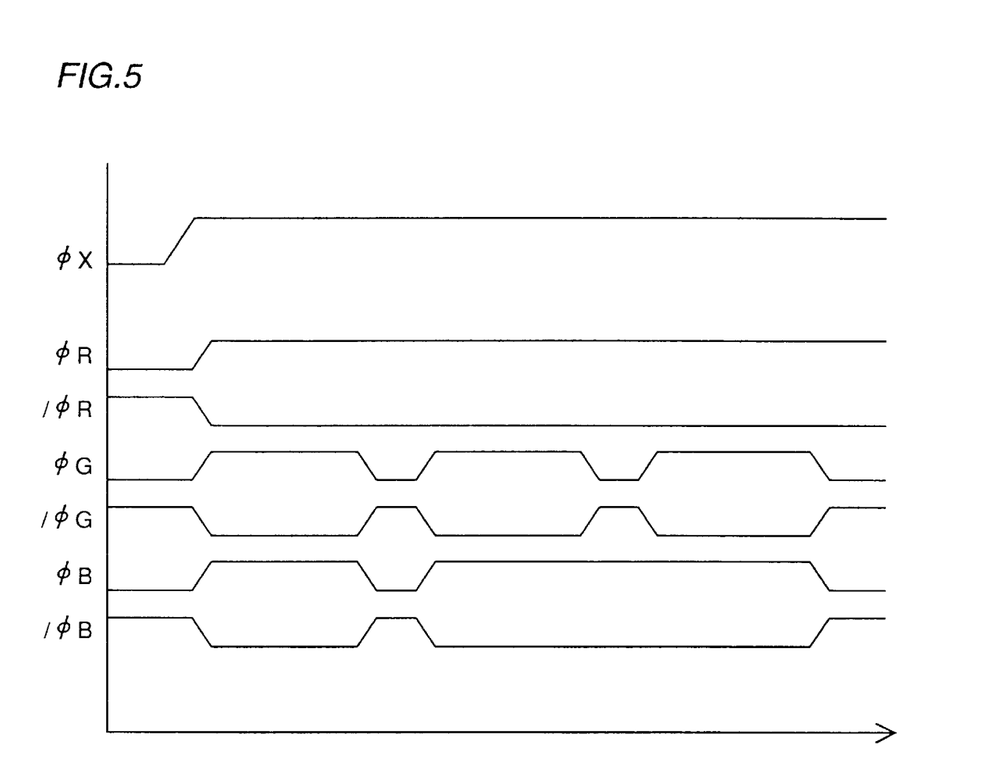
FIG. 5 is a timing chart of a sense amplifier drive signal output from a sense amplifier drive circuit 5 of the first embodiment of the present invention when a copy operation corresponding to FIG. 4 is carried out.

Referring to the timing chart of FIG. 5, sense amplifier drive circuit 5 receives a sense amplifier activation signal $\phi X$ of an H level to generate sense amplifier drive signals $\phi R$, $\phi G$, and $\phi B$, and respective inverted signals of $\phi R$, $\phi G$ and $\phi B$. Sense amplifier groups 1, 2 and 3 are rendered active/inactive according to a sense amplifier drive signal shown in FIG. 5.

In semiconductor memory device 100, a selective copy operation is carried out at high speed as set forth in the following according to change in sense amplifier drive signals $\phi R$, $\phi R$, $\phi G$, $\phi G$, $\phi B$, and $\phi B$, and the timing of selection of word line WLi by row decoder 11 (FIG. 1). The description for signals $\phi R$, $\phi G$, $\phi B$ will not be repeated in the following.

Figure 6:
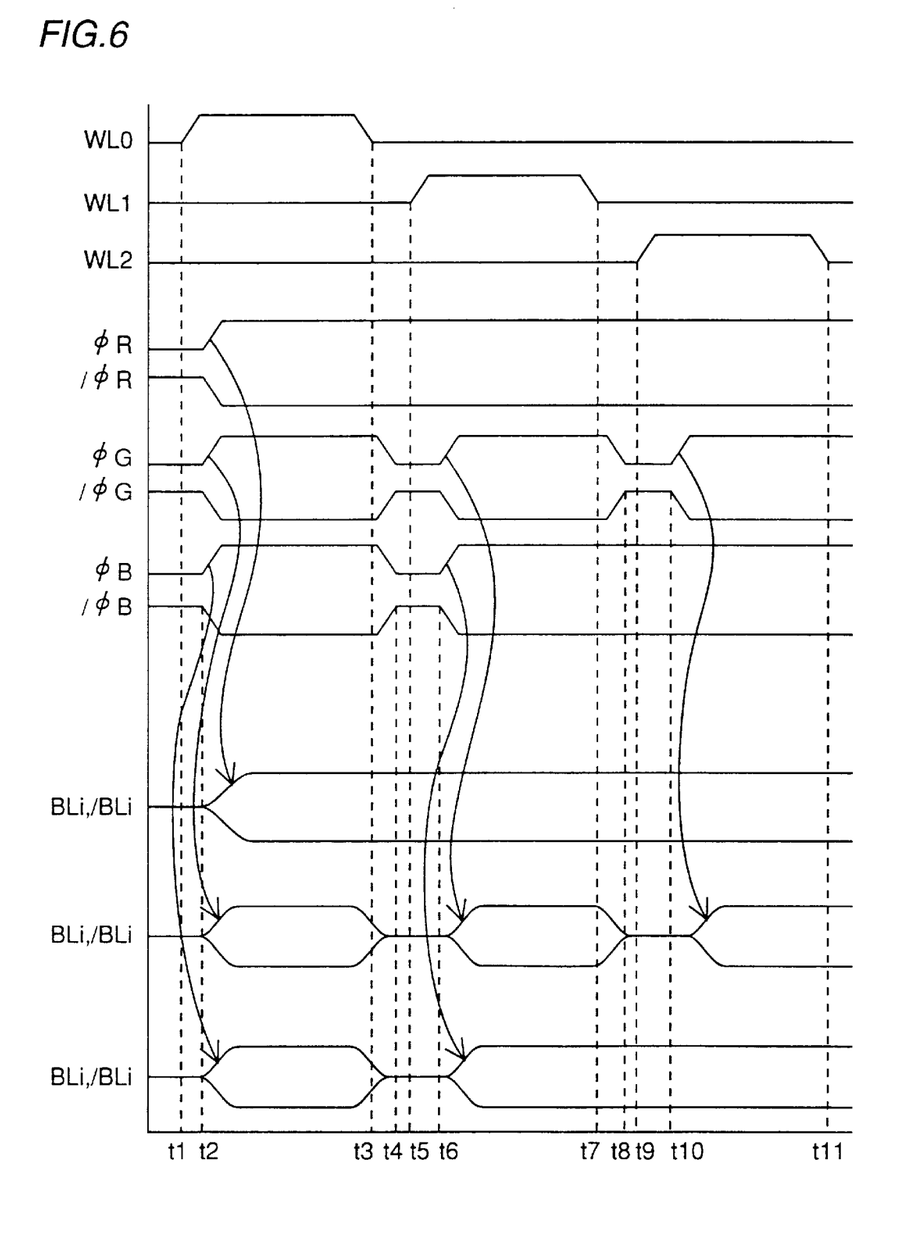
FIG. 6 is a timing chart for describing a copy operation carried out according to a sense amplifier drive signal shown in FIG. 5.

Referring to FIG. 6, the potential of word line WL0 is pulled up at time t1. In response, the potential of bit line pair BLi, /BLi connected to each memory cell 6 is altered according to the stored information of memory cell 6 connected to word line WL0.

At time t2, each of sense amplifier drive signals $\phi R$, $\phi G$, $\phi B$ is driven to an H level from an L level. In response, sense amplifiers SA1, SA2 and SA3 are respectively rendered active.

Each of sense amplifiers SA1, SA2 and SA3 senses the potential difference of a corresponding pair of bit lines BLi, /BLi and amplifies the potential difference. The readout data is written again into memory cell 6 connected to word line WL0.

At time t3, the potential of word line WL0 is pulled down. At this time point, sense amplifiers SA1, SA2 and SA3 have attained an active state to latch data corresponding to the stored information of memory cells 6 connected to word line WL0.

At time t4, sense amplifier drive signals $\phi G$ and $\phi B$ are pulled down to an L level from an H level. In response, sense amplifiers SA2 and SA3 are rendered inactive.

At time t5, the potential of word line WL1 is pulled up. In response, the potential of each bit line pair BLi, /BLi in regions G and B is altered according to the stored information in memory cell 6 connected to word line WL1. It is to be noted that sense amplifier SA1 maintains an active state. Therefore, each bit line pair BLi, /BLi in region R holds a potential according to the data latched by each sense amplifier SA1 (that is, the stored information of memory cell 6 connected to word line WL0).

At time t6, sense amplifier drive signals $\phi G$ and $\phi B$ are pulled up from an L level to an H level. In response, sense amplifiers SA2 and SA3 are rendered active. Each of sense amplifiers SA2 and SA3 senses the potential difference of a corresponding pair of bit lines BLi, /BLi to amplify the potential difference. The readout data is written again into memory cell 6 connected to word line WL1 in each of regions G and B.

At time t7, the potential of word line WL1 is pulled down. This causes the stored information of memory cell 6 connected to word line WL0 in region R to be copied to each memory cell 6 connected to word line WL1 in the same region R. The stored information in memory cell 6 connected to word line WL1 in regions G and B are maintained.

At time t8, sense amplifier drive signal $\phi G$ is pulled down from an H level to an L level. In response, sense amplifier SA2 is rendered inactive.

At time t9, the potential of word line WL2 is pulled up. In response, the potential of each bit line pair BLi, /BLi in region G is altered according to the stored information in memory cell 6 connected to word line WL2. Sense amplifier SA1 maintains its active state. Therefore, each bit line pair BLi, /BLi in region R maintains a potential corresponding to the data latched by each sense amplifier SA1 (that is, the stored information of memory cell 6 connected to word line WL0). Similarly, sense amplifier SA3 maintains an active state. Therefore, each bit line pair BLi, /BLi in region B maintains a potential according to the data latched by each sense amplifier SA3 (that is, the stored information in memory cell 6 connected to word line WL1).

At time t10, sense amplifier drive signal $\phi G$ is driven to an H level from an L level. In response, sense amplifier SA2 is rendered active. Sense amplifier SA2 senses the potential difference of a corresponding bit line pair BLi, /BLi to amplify the potential difference. The readout data is written again into memory cell 6 connected to word line WL1 of region G.

At time t11, the potential of word line WL2 is pulled down. This causes the stored information of memory cell 6 connected to word line WL0 in region R to be copied into each memory cell 6 connected to word line WL2 in the same region R. Also, the stored information of memory cell 6 connected to word line WL1 in region B is copied into each memory cell 6 connected to word line WL2 in the same region B. The stored information of memory cell 6 connected to word line WL2 in region G is maintained.

According to the first embodiment of the present invention, semiconductor memory device 100 has sense amplifiers SA1, SA2 and SA3 controlled independently, and word line WLi selected sequentially. Therefore, the stored information of memory cell 6 connected to word line WLi can be copied selectively and speedily to memory cell 6 connected to another word line WLk.

For example, by storing pixel data associated with red R in region R, the pixel data associated with green G in region G, and pixel data associated with blue B in region B in the case where semiconductor memory device 100 is used for image processing, the pixel data of interest (for example, the pixel data corresponding to red R) can be processed speedily without destructing other pixel data (for example, pixel data corresponding to green G or pixel data corresponding to blue B).

The above-described copy operation can be implemented by using a semiconductor memory device of a divided word line system and storing different types of pixel data for each divided word line. However, the divided word line method requires a decoder for a word line to be provided in addition to the conventional provided row and column decoders 11 and 12. Therefore, a greater chip area is required than in the case of semiconductor memory device 100.

Although not particularly described, an operation identical to conventional semiconductor memory device 200 shown in FIG. 7 can be carried out in semiconductor memory device 100 by controlling sense amplifier drive signals φR, φG and φB globally.

The first embodiment was described in which semiconductor memory device 100 includes three sense amplifier groups 1, 2 and 3. However, the present invention is not limited to three sense amplifier groups.

The first embodiment is applicable to an ACP operation (selection of row address) for selectively activating memory cell 6 connected to one word line WLi, and a PRE operation for precharging memory cell 6 of one selected word line WLi.

According to the semiconductor memory device of the present invention, data stored in a memory cell array can be copied speedily and selectively.

Furthermore, according to the semiconductor memory device of the present invention, data can be copied speedily and selectively by providing control of the timing of word line selection and the timing of activating/deactivating a plurality of sense amplifier groups that can be controlled independently. Since the above plurality of sense amplifier groups can be controlled independently by a signal, it is not necessary to provide an additional circuit such as a decoder to control the same. Therefore, increase in the chip area can be suppressed.

Furthermore, according to the semiconductor memory device of the present invention, data of interest can be copied speedily and selectively even in the case where there is a mixture of a plurality of different types of data without destructing the data of the type to be maintained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory cells arranged in rows and columns, and divided into a plurality of groups, wherein each of said plurality of groups includes a plurality of memory cells arranged in at least one said column, copy means for copying data stored in at least one memory cell in at least one of said plurality of groups into at least one another relevant memory cell in said at least one group.

2. The semiconductor memory device according to claim 1, further comprising:

a plurality of word lines arranged in said row, each word line being connected to a plurality of memory cells arranged in a corresponding one said row, and a row decoder connected to said plurality of word lines, wherein each of said plurality of groups comprises at least one bit line pair arranged in at least one said column, each bit line pair being connected to a plurality of memory cells arranged in said column, at least one sense amplifier provided corresponding to said at least one bit line pair, each sense amplifier being connected to a corresponding bit line pair, wherein said copy means control said row decoder such that said plurality of word lines are sequentially activated for a predetermined time, and for continuing to activate a sense amplifier in said at least one group after one of said plurality of word lines is activated.

3. The semiconductor memory device according to claim 2, wherein said copy means activates and deactivates a sense amplifier in another group after said one word line is activated and deactivated, respectively.

* * * * *

UNITED STATES PATENT AND TRADEMARK OFFICE
CERTIFICATE OF CORRECTION

PATENT NO. : 5,854,771
DATED : December 28, 1998
INVENTOR(S) : Kaori MORI

It is certified that error appears in the above-identified patent and that said Letters Patent is hereby corrected as shown below:

In the Drawings:

Label Figures 7-10 "PRIOR ART"

Signed and Sealed this

Eleventh Day of January, 2000

Attest:

Q. TODD DICKINSON

*Attesting Officer*   *Acting Commissioner of Patents and Trademarks*